Figure 1:
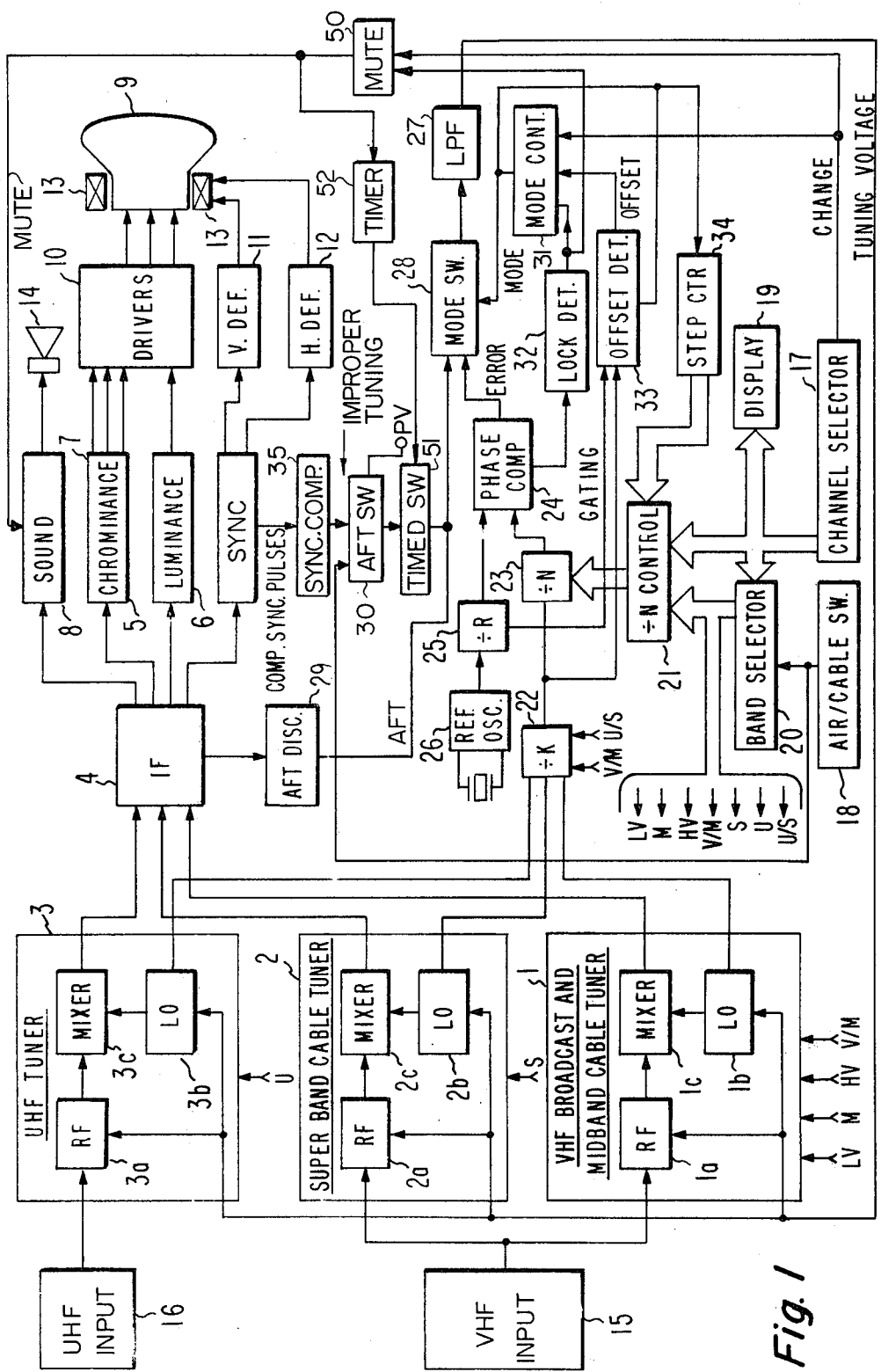

United States Patent [19]

George et al.

[11] 4,385,315
[45] May 24, 1983

[54] PHASE LOCKED LOOP TUNING CONTROL SYSTEM INCLUDING A TIMED SYNC ACTIVATED AFT SIGNAL SEEKING ARRANGEMENT

[75] Inventors: John B. George; William J. Testin, both of Indianapolis, Ind.

[73] Assignee: RCA Corporation, New York, N.Y.

[21] Appl. No.: 261,447

[22] Filed: May 8, 1981

[51] Int. Cl.³ .............................................. H04N 5/44
[52] U.S. Cl. .............................. 358/191.1; 358/195.1; 455/182
[58] Field of Search ....................... 358/191.1, 195.1; 455/31, 136, 150, 164, 173, 182, 192

[56] References Cited

U.S. PATENT DOCUMENTS

| | | |
|---|---|---|
| 3,858,000 | 12/1974 | Merriweather et al. |
| 3,867,568 | 2/1975 | Merriweather. |
| 3,944,725 | 3/1976 | Arumugham et al. |
| 3,952,143 | 4/1976 | Siwko. |
| 4,000,476 | 12/1976 | Walker et al. |
| 4,025,953 | 5/1977 | Sideris. |
| 4,031,549 | 6/1977 | Rast et al. |
| 4,077,008 | 2/1978 | Rast et al. |
| 4,077,016 | 2/1978 | Sanders et al. |
| 4,078,212 | 3/1978 | Rast. |
| 4,109,283 | 8/1978 | Rast. |
| 4,300,165 | 11/1981 | Kim ................................. 358/195.1 |

OTHER PUBLICATIONS

U.S. Patent Application S.N. 211,704 entitled "Phase Locked Loop Tuning Control System Including a Sync Activated AFT Signal Seeking Arrangement", filed in the name of M. P. French on 12-1-80.

U.S. Patent Application S.N. 261,450 entitled "Dual Search Mode Type Tuning System", filed in the names of J. Tults and M. P. French on 5-8-81.

*Primary Examiner*—Richard Murray
*Attorney, Agent, or Firm*—E. M. Whitacre; P. J. Rasmussen; P. M. Emanuel

[57] ABSTRACT

In a phase locked loop PLL tuning control system for a voltage controlled oscillator of the type wherein an automatic fine tuning (AFT) voltage is selectively applied to the local oscillator after a PLL configuration has obtained lock at the nominal frequency value for the selected channel so as to accommodate frequency translated RF carriers, an AFT control circuit selectively activated by the average level of composite synchronization pulses indicative of an improper tuning condition caused by certain translated carriers clamps the AFT voltage at a predetermined level. The predetermined level is selected to force the local oscillator frequency to be driven to an offset value at which an offset detector causes reinitiation of PLL control at discrete frequency step from the nominal value for the selected channel so as to properly tune the translated carrier. A timed switching arrangement only allows the AFT control circuit to operate for a predetermined time after a new channel is selected so that channels, such as music channels, which do not provide synchronization pulses, can be tuned.

6 Claims, 3 Drawing Figures

PHASE LOCKED LOOP TUNING CONTROL SYSTEM INCLUDING A TIMED SYNC ACTIVATED AFT SIGNAL SEEKING ARRANGEMENT

The present apparatus pertains to the field of phase locked loop (PLL) tuning control systems for a local oscillator including a mode switching arrangement for selectively applying an automatic fine tuning (AFT) signal to the local oscillator after the PLL portion of the system is locked to accommodate frequency translations of received RF carriers. Such a tuning control system is described in U.S. Pat. No. 4,031,549, entitled "Television Tuning System with Provisions for Receiving RF Carriers at Non-Standard Frequencies", issued in the name of Rast et al. on June 21, 1977, and U.S. Pat. No. 4,109,283 entitled "Frequency Counter for a Television Tuning System", issued in the name of Rast on Aug. 22, 1978. These patents are incorporated by reference for their detailed disclosure or portions of an embodiment of the present invention to be described below.

In the tuning control system described in the above-identified patents, an offset detector determines when the frequency of the local oscillator signal, under AFT control, exceeds a predetermined offset, e.g., 1.25 MHz, from its nominal value established under PLL control. When the latter occurs, control of the local oscillator is returned to PLL control and a programmable division factor of a counter within the PLL portion is changed to discretely shift the frequency of the local oscillator signal. This is done to enable the AFT signal to be used to acquire signals with frequency translations of approximately ±1.5 MHz using a conventional AFT discriminator with a normal range of only approximately ±0.5 MHz.

In CATV (cable television) and MATV (master antenna) systems for distributing television signals, television signals are often modulated or remodulated onto RF carriers which have imprecise or non-standard frequencies compared with respective broadcast RF carriers. The imprecision may arise due to tolerance variations in the modulation apparatus of the distribution equipment or because of the intentional selection of certain reference frequency signals for use in the modulation apparatus. Specifically, with respect to the latter situation, since the frequency spacing between most television broadcast channels allocated to the various television frequency bands is 6 MHz in the United States, RF carriers for distribution in a CATV system are often derived by generating harmonics of a 6 MHz reference frequency signal. As a result, the cable RF carriers are translated in frequency by −1.25 MHz from respective broadcast RF carriers. Specifically, for example, the RF picture carrier for channel 2 occurs at 54 MHz (i.e., the ninth harmonic of 6 MHz) rather than at 55.25 MHz, the standard broadcast RF picture carrier frequency for channel 2.

While PLL tuning control systems of the type described above should be capable of handling such translations, difficulty has been found to arise because of interference or beat signal products which may be undesirably produced by non-linear signal processing circuits included, e.g., in the RF and IF sections of television receivers. This may be understood with reference to the amplitude versus frequency response characteristic of a typical AFT discriminator employed in conventional television receivers graphically illustrated in FIG. 2. The response characteristic includes a desired S-shaped control portion approximately between ±0.5 MHz from 45.75 MHz. When an RF picture carrier is translated in frequency by approximately −1.25 MHz, and the local oscillator frequency is at the broadcast nominal value, it has been found that a beat signal may be produced having a frequency between +1.25 MHz and +1.75 MHz from 45.75 MHz. It is believed that the beat signal is due to the non-linear combination of the IF picture carrier of the selected channel and the IF sound carrier of the lower adjacent channel. The beat signal causes the AFT response characteristic to exhibit another and undesired S-shaped control portion approximately between +1.25 MHz and +1.75 MHz from 45.75 MHz.

Under the above conditions, after the PLL configuration has caused the frequency of the local oscillator signal to be at its nominal value for the selected channel and AFT control of the local oscillator has been initiated, a stable tuning condition in which the undesired beat signal is tuned can be established in response to the undesired control portion of the AFT signal between +1.25 MHz and +1.75 MHZ from 45.75 MHz. Since during the AFT control cycle the frequency of the local oscillator signal will not be offset by more than 1.25 MHz from its value previously established under PLL control, PLL control is not reinitiated with the frequency of the local oscillator shifted as it should be to correct the improper tuning condition. The invention described in U.S. patent application Ser. No. 211,704, entitled "Phase Locked Loop Tuning Control System Including a Sync Activated AFT Signal Seeking Arrangement", filed on Dec. 1, 1980 in the name of M. P. French and assigned, like the present application, to RCA Corporation, is directed at correcting this type of problem.

According to the French invention, for use in a PLL tuning control system of the type described above there is included a comparator for determining when a signal component derived from the IF signal, such as a picture synchronization component, has a predetermined condition corresponding to an improper tuning condition and an arrangement selectively activated by the comparator for causing the AFT signal coupled to the local oscillator during an AFT control cycle to assume a predetermined level when the improper tuning condition occurs. The predetermined level is selected to drive the frequency of the local oscillator signal to exceed the predetermined frequency offset for the AFT control cycles. When the latter condition occurs, the offset detector causes the reinitiation of PLL control to establish the frequency of the local oscillator signal at a discrete frequency step away from the frequency at which it was previously incorrectly established under AFT control Unfortunately, the French apparatus inhibits the tuning of desired channels that have unmodulated picture carriers and therefore are absent a picture synchronization component. The most common of such desired channels are the so-called "music channels" often provided by certain CATV and MATV television signal distribution systems by which music is distributed on unused television channels. These music channels provide a modulated sound carrier but an unmodulated picture carrier. In essence, because the picture synchronization component is absent, the French apparatus will cause the frequency of the local oscillator signal to be automatically and repetitively changed away from the proper frequency for tuning the music channel. This results in annoying interference in the form of a "ticking" sound which distorts the audio signal. It has also been found to produce a disconcerting visual flashing effect.

Video accessories such as video cameras, video cassette players, and video disc also produce unacceptable picture carriers at certain times. For example, when a video camera is turned off, a video cassette player is playing an unrecorded portion of a tape or a video disc player is in a pause mode, a picture synchronization component is not produced. Accordingly, under these standby conditions the undesired audio ticking and video flashing is also produced. While with respect to video accessories, this undesired condition is only temporary and will be relieved when the picture synchronization component is reestablished, it is nevertheless desirable to avoid it.

The present apparatus is an improvement for the French apparatus which, while allowing the French apparatus to operate to inhibit the tuning of undesired signals as described above, also permits signal sources, such as music channels and video accessories operating in certain temporary modes with unmodulated picture carriers, to be properly tuned.

Specifically, in an embodiment of the present invention, in a PLL tuning control system of the type described above which has a PLL operating mode and an AFT operating mode, and including a comparator for determining when a signal component derived from the IF signal has a predetermined condition, e.g., contains a synchronization component, and an AFT control arrangement selectively activated by the comparator to cause the AFT signal coupled to the local oscillator during the AFT operating mode to assume a predetermined level in response to which the PLL operating mode is initiated at a different frequency step in order to avoid tuning an undesired signal which does not produce the predetermined condition, a timing circuit is introduced to inhibit the AFT control arrangement from affecting the level of the AFT signal after a predetermined time to allow desired signals which properly do not produce the predetermined condition to be tuned.

Figure 2:
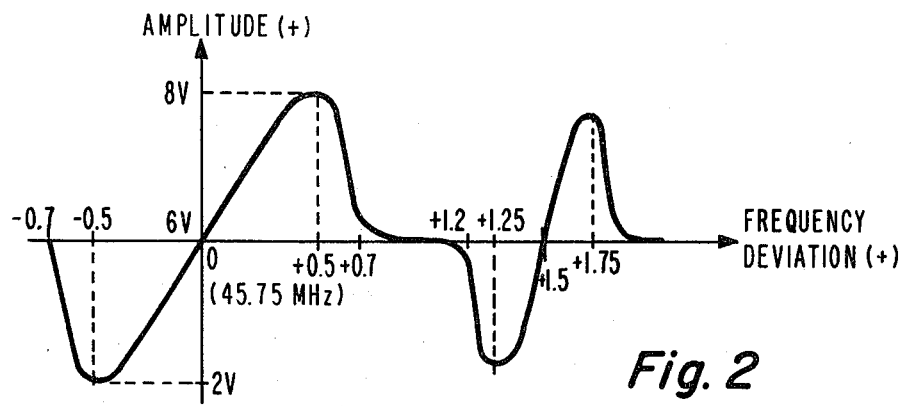
Figure 3:
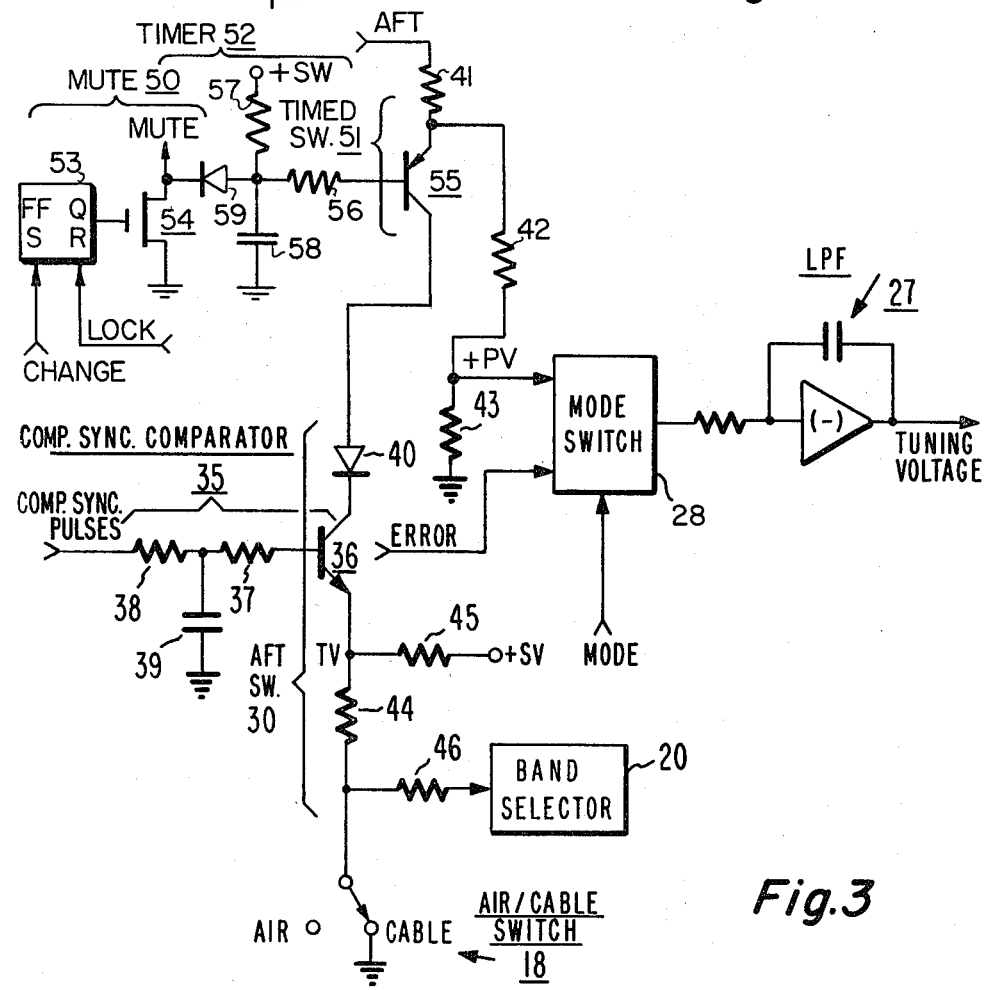

The present invention will be described in more detail with reference to the accompanying Drawing in which:

FIG. 1 shows in block diagram form an embodiment of the present invention incorporated in a color television receiver;

FIG. 2 graphically illustrates the AFT discriminator amplitude versus frequency response characteristic referred to above; and FIG. 3 shows in schematic form a circuit implementation of a portion of the embodiment of the present invention shown in FIG. 1.

The color television receiver shown in FIG. 1 includes three selectively enabled tuner sections 1, 2 and 3 for heterodyning broadcast and cable RF carriers with local oscillator signals having appropriate frequencies for the selected channel to produce respective IF signals. The IF signal generated by the enabled one of tuners 1, 2 and 3 is filtered and amplified by an IF section 4. The IF signal processed by IF section 4 includes picture, color and sound carriers. In the United States, the IF picture, color and sound carriers have respective nominal frequencies of 45.75 MHz, 42.17 MHz and 41.25 MHz. In the United States the local oscillator (LO) frequencies, $f_{LO}$, are higher than the RF carrier frequencies, $f_{RF}$. The following equation defines the relationship between the RF, IF and LO frequencies.

$$f_{IF} = f_{LO} - f_{RF} \tag{1}$$

It will be noted that the IF carrier frequencies vary inversely with respect to the RF carrier frequencies.

Luminance and synchronization signals are derived from the picture carrier by luminance and synchronization sections 5 and 6, respectively. Color signals are derived from the color carrier by chrominance section 7. Sound signals are derived from the sound carrier by sound section 8. Luminance section 5 controls the detail, contrast and brightness of a picture produced by a picture tube 9. Chrominance section 7 controls the color properties, i.e., saturation and hue, of the picture. After processing, the luminance and chrominance signals (the latter corresponding to the primary colors red, green and blue) are combined by a picture tube driver 10 and applied to picture tube 9. Synchronization section 6 derives composite horizontal and vertical synchronization pulses. Vertical and horizontal deflection sections 11 and 12 respond to respective synchronization pulses to generate electron beam deflection signals applied to deflection cores 13 associated with picture tube 9. Sound section 8 provides audio signals to a speaker 14.

In the United States, RF carriers heterodyned by tuners 1, 2 and 3 reside in the frequency bands indicated in the following table.

| BAND | RF RANGE(MHz) | CHANNEL NUMBER | LO RANGE(MHz) |
| --- | --- | --- | --- |
| low VHF broadcast (LV) | 54–88 | 2–6 | 101–129 |
| midband cable (M) | 90–174 | (A-5)–I | 137–215 |
| high VHF broadcast (HV) | 174–216 | 7–13 | 221–257 |
| super band cable (S) | 216–402 | J–(W + 17) | 263–443 |
| UHF broadcast (U) | 470–890 | 14–83 | 517–931 |

Tuner 1 heterodynes RF carriers in the VHF broadcast and midband cable bands. Tuner 2 heterodynes RF carriers in the super band cable bands. Tuner 3 heterodynes RF carriers in the UHF broadcast band. Tuners 1, 2 and 3 are selectively enabled to operate in response to respective band switching signals V/M, S and U generated by a phase locked loop (PLL) tuning control system to be described below in accordance with the band of the selected channel.

A VHF antenna network, a cable installation or a video accessory such as a video cassette player, video disc player or video camera may be connected by a user to a VHF input 15 which includes a high pass filter for passing RF carriers in the VHF broadcast and superband and midband cable bands and rejecting signals outside these bands. Input unit 15 is connected to tuner 1 and tuner 2. A UHF antenna network may be connected to a UHF input 16 which includes an impedance transforming network for transforming balanced impedance configuration of the UHF antenna network to an unbalanced configuration substantially matching the input of tuner 3.

Each of tuners 1, 2 and 3 includes an RF section "a" for selecting a particular RF carrier associated with a selected channel, a local oscillator (LO) "b" for generating a local oscillator signal having the appropriate frequency for heterodyning the selected RF carrier and a mixer "c" for combining the selected RF carrier and local oscillator signal to produce the respective IF signal. In each of tuner 1, 2 and 3, RF section "a" and local oscillator "b" include tuned circuits having their frequency response controlled in response to the magnitude of a tuning voltage generated by the PLL tuning control system in accordance with the channel number and band of the selected channel. Typically, the tuned circuits include the parallel combination of an inductive circuit and a varactor diode which is reverse biased to exhibit a capacitive reactance having a value determined by the magnitude of the tuning voltage. Since VHF broadcast and midband cable tuner 1 must tune over a frequency range too large to permit the use of a single inductor in each of its tuned circuits, its tuned circuits include respective inductor selection arrangements (not shown) for selecting the appropriate inductor configuration in response to respective band switching signals LV, M and HV.

Channels are selected by a channel selection unit 17, e.g., including a calculator-like keyboard and/or up and down channel scanning keys, for generating first and second groups of BCD (binary coded decimal) signals representing the tens and units decimal digits, respectively, of the channel number corresponding to a selected channel.

The channel numbers for the various bands are indicated in the above table. It will be noted that the cable channels are identified by letters as well as numbers. An air/cable switch 18 is provided to enable the channel selection unit 17 to be used to select cable channels as well as "off-the-air" broadcast channels. When switch 18 is in an "air" position, operation of channel selection unit 17 causes the generation of the first and second groups of BCD signals corresponding to the tens and units digit of the channel number of the respective broadcast channel and the subsequent tuning of the respective broadcast RF carrier. When switch 18 is in a "cable" position, operation of channel selection unit 17 normally causing the generation of the first and second groups of BCD signals corresponding to the tens and units digit of the channel number of a broadcast channel and the subsequent tuning of the respective broadcast RF carrier, causes the tuning of a respective cable-carrier which has been assigned, as indicated on a chart supplied with the receiver, to the selected broadcast channel number.

When a video accessory is connected to VHF input 15, the user selects the appropriate one of channel 3 or channel 4. Video accessories selectively produce RF carriers having frequencies corresponding to those of the broadcast RF carriers for either channel 3 or channel 4. Accordingly, the BCD signals generated by channel selection unit 17 are applied to a channel number display unit 19, a band selector 20 and a divider ($\div$N) control unit 21 of the PLL tuning control system. Band selector 20, which is also responsive to the position of air/cable switch 18, generates band selection signals representative of the band of the selected channel. In addition to band selection signals for the LV, M, HV, S and U bands, band selection unit 15 generates a V/M band selection signal when the selected channel is in one of the LV, HV or M bands and a U/S when the selected channel is in one of the U or S bands. As noted above, the V/M, U and S band selection signal activates the tuners 1, 2 and 3, respectively, to heterodyne the corresponding RF carriers and the LV, M and HV band selection signals select the respective inductor configurations of the tuned circuits of tuner 1.

As described above, the frequencies cable RF carriers may be translated with respect to respective broadcast RF carriers. The PLL tuning control system is of the type described above for accommodating nonstandard frequency as well as standard frequency RF carriers. The PLL tuning system includes: a PLL configuration for causing tuners 1, 2 and 3 to be tuned to standard frequencies corresponding to the standard frequency RF broadcast carriers associated with selected channels; an AFT configuration for causing tuners 1, 2 and 3 to be tuned so as to reduce deviations between the frequency of the picture carrier of the IF signal and its nominal value, e.g., 45.75 MHz, which may occur due to the reception of nonstandard frequency RF carriers; and a mode selection arrangement for selectively enabling the operations of either the PLL or AFT configurations.

The PLL configuration includes a prescaler 22 for dividing the frequency of the local oscillator signal selectively applied to it by the enabled one of tuners 1, 2, 3 by a division factor K sufficient to bring the frequency of the resultant signal within the operating range of a following programmable divider 23. Since the frequency range of the local oscillator signals of tuner 1 is considerably lower than the frequency range of local oscillator signals of tuners 2 and 3, (e.g., in the United States, by a factor of 4), division factor K is controlled in response to the U/S and V/M band-switching signals. Programmable divider 23 divides the frequency of the output signal of prescaler 22 by a programmable factor N determined by divider ($\div$N) control unit 21 in accordance with the channel number and band of the selected channel. A phase comparator 24 compares the phase and/or frequency of the output signal of programmable divider 18 and a reference frequency signal to generate an "error" signal having pulses with widths and transition directions related to the magnitude and sense, respectively, of the phase and/or frequency deviations between the output signal of programmable divider 23 and the reference frequency signal. The reference frequency signal is derived by a frequency divider ($\div$R) 25 which divides the frequency of the output signal of a crystal oscillator 26. The division factor R of programmable divider 25 may also be controlled in accordance with the frequency band of the selected channel in response to the U/S and V/M band selection signals.

The error pulses generated by pulse comparator 24 are selectively applied to the input of a low pass filter (LPF) 27 by a mode switch 28 of the mode selection arrangement to be further described below. In response to the error pulses a tuning voltage is generated at the output of LPF 27 and applied to the enabled one of tuners 1, 2 and 3. During the subsequent operation of the PLL configuration, the described below. In response to the error pulses a tuning voltage is generated at the output of LPF 27 and applied to the enabled one of tuners 1, 2 and 3. During the subsequent operation of the PLL configuration, the magnitude of the tuning control voltage changes in accordance with the phase and frequency deviations between the frequency-divided local oscillator signal and the reference frequency signal in a sense to reduce the deviations. When the deviations have been minimized, the frequency of the local oscillator signal $f_{LO}$ will have a value proportional to the frequency of the crystal oscillator signal, $f_{XTAL}$, by the following expression:

$$f_{LO} = N \, K/R \, f_{XTAL} \qquad (2)$$

Desirably, the factor $K/R \, f_{XTAL}$ is made equal to 1 MHz, so that the programmable division factor N of divider 23 is equal, in MHz, to the frequency of the local oscillator signal.

The AFT configuration includes an AFT discriminator 29 of the conventional type for generating an AFT signal having a generally S-shaped amplitude versus frequency characteristic representing the magnitude and sense of deviation of the frequency of the IF picture carrier from its nominal value, e.g., 45.75 MHz, as shown in FIG. 2. The AFT signal is selectively applied to the input LPF 27 by mode switch 28. In response, the tuning control voltage developed at the output of LPF 27 is responsive to the AFT signal. During the subsequent operation of the AFT configuration, the frequency of the local oscillator signal is adjusted from its value established during the previous operating cycle of the PLL configuration to correct for any deviations of the frequency of the IF picture carrier from 45.75 MHz due to corresponding translations of the frequency of the received RF carrier.

The mode switching apparatus for selectively coupling either the output of phase comparator 24 or AFT discriminator 29 to LPF 27 includes mode switch 28 comprising a double thrown, single pole electronic switching device and a mode control unit 31 for controlling the "position" of mode switch 28. Mode control unit 31 includes: a flip flop (not shown) for generating a "mode" signal having a first binary level for causing mode switch 28 to apply the output signal of phase comparator 24 to LPF 27 and a second binary level for causing mode switch 28 to apply the output signal of AFT discriminator 29 to LPF 27; and combinational logic (not shown) for controlling the state of the flip flop in response to signals generated by channel selection unit 17, a lock detector 32, and an offset detector 33.

When a new channel is selected, a "change" pulse is generated by channel selection unit 17. In response to the "change" pulse, the "mode" signal is set to its first level. In response to the first level, mode switch 28 applies the error signal generated by phase comparator 24 to LPF 27 and thereby enables the operation of the PLL configuration.

When the phase and/or frequency deviations between the frequency divided local oscillator signal and reference frequency signal have been substantially minimized, the pulses of the error signal generated by phase comparator 24 will have relatively short durations. Lock detector 32 examines the durations of the error pulses and when the latter condition occurs generates a "lock" signal. Mode control unit 31 responds to the "lock" signal and causes the "mode" signal to be set to its second level. In response to one second level, mode switch 28 applies the AFT signal generated by AFT discriminator 29 to LPF 27 and thereby enables the operation of the AFT configuration. It is assumed at this point that the state of AFT switch 29 is such that the AFT signal is applied to mode switch 28.

At any time after the initiation of the AFT arrangement, should the frequency of the local oscillator signal applied from the enabled one of tuners 1, 2 and 3 be offset from the value established during the operation of the PLL configuration by a predetermined amount, e.g., 1.25 MHz, offset detector 33 detects the occurrence and generates an "offset" signal. Offset detector 33 is enabled to operate in response to the second level of the "mode" signal. As described in detail in the aforementioned Rast patent, offset detector 33 includes a counter (not shown) and a switch (not shown) controlled in response to a "gating" signal generated by reference divider ($\div R$) 25 to selectively apply output signals of prescaler 22 to the counter. The count accumulated by the counter during a predetermined time interval of the "gating" signal is indicative of the frequency offset of the local oscillator signal under AFT control. In response to the "offset" signal, the "mode" signal is reset to its first level thereby ending the operation of the AFT configuration and reestablishing the operation of the PLL configuration. Local oscillator frequency offsets greater than 1.25 MHz are to be avoided to avoid tuning the receiver to the sound carrier of the lower adjacent channel, with reference to the IF range, which sound carrier is separated from the picture carrier of the selected channel by 1.5 MHz.

Certain cable and master antenna installations may provide nonstandard frequency RF carriers translated in frequency from respective standard frequency RF carriers typically provided by broadcast transmitters by more than the AFT control range, e.g., approximately ±0.5 MHz. Accordingly, to expand to tuning range of the PLL tuning control system, a "step" counter 34 is included for incrementally changing the value of N in response to the generation of the "offset" signal when the operation of the PLL configuration is reinitiated.

Specifically, in response to the first generation of the "offset" signal during the first AFT operating cycle after a new channel has been selected, step counter 34 is set to a predetermined state which causes the value of N to be increased by 1 with respect to the nominal value for the selected channel and the operation of the PLL configuration is reinitiated. Accordingly, the frequency of the local oscillator signal is increased by 1 MHz with respect to the nominal frequency for the selected channel. Thereafter, when the "lock" signal is again generated, the operation of the AFT arrangement is initiated for the second time. In this manner, the tuning control system is capable of locating and tuning nonstandard frequency RF carriers which may be translated in frequency from respective standard frequency RF carriers by +1±0.5 MHz (±0.5 MHz being the control range of the AFT signal).

If no RF carrier is located for the increased value of N, a second "offset" signal will be generated during the second AFT operating cycle when the frequency of the local oscillator signal is caused to be more than 1.25 MHz from the value established previously under the control of the PLL configuration. In response to the second generation of the "offset" signal, step counter 34 is set to a state causing the value of N to be decreased by 1 with respect to its nominal value for the selected channel and the operation of the PLL configuration is again reinitiated. Accordingly, the frequency of the local oscillator signal is decreased by 1 MHz with respect to the nominal frequency for the selected channel. Thereafter, when the "lock" signal is again generated, the operation of the AFT arrangement is initiated for the third time. In this manner, the tuning control system is capable of locating and tuning nonstandard frequency RF carriers which may be translated in frequency from respective standard frequency RF carriers by $-1\pm 0.5$ MHz.

If no RF carrier is located for the $-1$ MHz step, in response to the third generation of the "offset" signal during the third AFT control operation, the value of N is decreased by 2 with respect to its nominal value for the selected channel and a fourth PLL control operation is initiated. Thereafter, when the "lock" signal is again generated, the operation of the AFT arrangement is initiated for the fourth time. In this manner, the tuning control system is capable of locating and tuning nonstandard frequency RF carriers which may be translated in frequency from respective standard RF carriers by $-2\pm 0.5$ MHz.

If no RF carrier is located for the $-2$ MHz step, in response to the fourth generation of the "offset" signal the value of N is set to its nominal value for the selected channel and PLL control operation is once again initiated. Thereafter, when the "lock" signal is again generated, AFT operation is once again initiated. If an "offset" signal is generated, PLL operation is again initiated. However, the value of N is not changed from its nominal value. When the "lock" signal is generated, AFT operation is again initiated. The tuning control system continues to repetitively switch between PLL and AFT operations, with the nominal value of N being established during PLL operation, until an RF carrier is located or a new station is selected. The reasons for this is that it is assumed that most RF carriers have frequencies within the AFT range from their standard values. Accordingly, if a carrier exists for the selected channel but was temporarily absent when the channel was first selected, it will most likely be found when it returns with the nominal value of N.

When a new channel is selected, the corresponding change in tuning voltage as the nominal local oscillator frequency of the new channel is synthesized may cause disturbing audio responses to be generated as the carriers for channels between the old and new channel are tuned. To minimize such audio disturbances, the sound is "muted", i.e., its level is significantly reduced, when a new channel is selected. Specifically, a mute unit 50 responds to the "change" signal to generate a "mute" signal. In response to the "mute" signal, sound processing unit 8 reduces the sound level. When the nominal local oscillator frequency has been synthesized, mute unit 50 responds to the "lock" signal generated by lock detector to end the "mute" signal. In turn, sound processing unit 8 restores the sound level to its previous value.

It has been found that the above-described step sequence allows a majority of nonstandard frequency carriers to be located without falsely tuning undesired signals such as the sound carrier of the lower adjacent channel (with reference to the RF range). However, as previously described with reference to FIG. 2, it has been found that when the RF carrier is translated approximately $-1.25$ MHz from its standard value, an undesired beat signal may be produced approximately between $+1.25$ and $+1.75$ MHz from 45.75 MHz. Depending on the amplitude of the beat signal, this may cause AFT discriminator 29 to exhibit an undesired control range between $+1.25$ and $+1.75$ from 45.75 MHz. Accordingly, under these conditions, when the AFT control cycle is initiated after the first PLL control cycle, a tuning condition may be established in which the undesired beat signal is erroneously tuned in response to the portion of the AFT signal between $+1.25$ and $+1.75$ from 45.75 MHz. Absent AFT switch 30 and composite synchronization comparator 35, to be described below, this erroneous tuning condition would be incorrectly maintained. This is so because although the IF picture carrier may be more than $+1.25$ MHz from 45.75 MHz, the frequency of the local oscillator signal will not have been offset by more than 1.25 MHz from its starting value, i.e., the value established during the first PLL control cycle. Under the latter conditions, absent an AFT switch 30 and a composite synchronization comparator 35, offset detector 33 will not generate an "offset" signal and the tuning control system erroneously remains under AFT control with the undesired beat signal tuned.

Assuming a timed switch 51, the function of which will be described below, is closed, AFT switch 30 and composite synchronization comparator 35 cooperate to correct improper tuning conditions of the type described above. Specifically, composite synchronization comparator 35 detects improper tuning conditions of the type described above by examining the composite synchronization pulses generated by synchronization section 6. When an RF carrier is properly tuned, composite synchronization pulses have a predetermined duty cycle. It has been found that when an improper signal is tuned, there are many more erroneous pulses compared with the normal number of composite synchronization pulses per unit of time generated by synchronization section 6 due to the presence of IF noise components. Composite synchronization comparator 35 detects this occurrence and in response generates an "improper timing" signal. AFT switch 30 is activated in response to the "improper tuning" signal and causes the predetermined offset of 1.25 MHz to be exceeded. Specifically, assuming timed switch 51 is closed, AFT switch 30 responds to the "improper tuning" signal to effectively decouple the AFT signal from mode switch 28 by coupling a predetermined voltage PV to mode switch 28. The polarity and magnitude of predetermined voltage PV are selected so that the tuning voltage driven to a corresponding polarity and magnitude condition at which the frequency of the local oscillator signal is assured to have more than the predetermined offset from its nominal value established during the first PLL control cycle.

In the improper tuning condition described above, during the first AFT control cycle, the improper tuning condition will be detected by composite synchronization comparator 35 and in response AFT switch 30 will be activated to cause the predetermined offset of $+1.25$ to be exceeded during the first AFT control cycle. This in turn causes the second PLL control cycle to be initiated in which the frequency of local oscillator signal is shifted by $+1$ MHz from its nominal value established during the first PLL control cycle. The frequency shift of $+1$ MHz of the local oscillator signal in combination with the frequency translation of the RF carrier of $-1.25$ MHz causes a corresponding frequency shift of the IF signal of $+2.25$ from 45.75 MHz (see equation (1)). At the latter shifted frequency, an improper tuning condition will again be detected by horizontal synchronization detector 35 and in response AFT switch 30 will be activated to cause the predetermined offset of 1.25 MHz to be exceeded during the second AFT control cycle. In turn the third PLL control cycle is initiated.

During the third PLL control cycle the frequency of the local oscillator signal is shifted by $-1$ MHz from its nominal value established during the first PLL control cycle. The frequency shift of −1 MHz of the local oscillator in accordance with the frequency translation of the RF carrier of −1.25 MHz causes a corresponding frequency shift of the IF signal of +0.25 from 45.75 MHz. Since the IF picture carrier will now be within the desired AFT control range between ±0.5 MHz from 45.75, it can be tuned during the third AFT control cycle.

It has been found, for the most part, that the composite synchronization pulses have approximately the correct duty cycle as long as the IF picture carrier is within the proper control range of the AFT signal, i.e., approximately between ±0.5 MHz from 45.75 MHz. Accordingly, composite synchronization comparator 35 has been found not to generate an "improper tuning" signal and thereby not improperly terminate an AFT control cycle, for the most part, unless an improper tuning condition of the type described above occurs. Thus, RF carriers which are translated in frequency so that the corresponding IF signal is within the AFT control range of any of the IF frequency steps corresponding to the steps of N may be located and tuned as described above.

Since the improper tuning condition described above due to frequency translations of RF carriers are most likely to occur only when the RF carriers are provided by a cable distribution system, AFT switch 30 is disabled by air/cable switch 18 when the latter is in the "air" position. In addition, since "off-the-air" RF carriers may be "weaker", i.e., have lower amplitudes and contain more noise components than cable RF carriers, it is desirable to disable AFT switch 30 when "off-the-air" RF carriers are being received to prevent false triggering in response to noise components.

While AFT switch 30 and composite synchronization comparator 35 operate successfully to inhibit the improper tuning conditions described above with respect to FIG. 2 as earlier mentioned, they unfortunately also inhibit the tuning of music channels which have a modulated sound carrier but an unmodulated picture carrier. It has been found that the picture carriers of music channels typically have frequencies very close to the corresponding standard broadcast frequencies. Accordingly, in the absence of AFT switch 30 and composite synchronization comparator 35, music channels would be tuned during the first AFT control operation after the first PLL control operation has established the local oscillator frequency at its nominal value for the selected channel. However, because the picture carrier is unmodulated, there are no synchronization pulses. Moreover, it has been found that the unmodulated picture carrier on music channels is relatively weak and produces an erroneous number of pulses compared with the normal number of composite synchronization pulses. Synchronization comparator 35 responds to this condition to generate an improper tuning signal which activated AFT switch 30. Accordingly, during the first AFT control cycle the local oscillator frequency is changed from the frequency, i.e., the nominal frequency, at which the music channel would otherwise be tuned. After the +1, −1 and −2 MHz steps, during each of which AFT switch 30 is activated by synchronization comparator 35 because of the absence of synchronization pulses to initiate the next step, the nominal local oscillator frequency is once again established and thereafter AFT control is again initiated. However, AFT switch 30 is again activated due to the absence of synchronization pulses. Thereafter, the PLL and AFT control operations are repetitively activated, thereby inhibiting the tuning of the music channel and also creating the annoying audio "ticking" and picture "flashing" earlier referred to. Similarly, when video accessories are in standby conditions and the picture carriers they produce are unmodulated, the same type of undesirable audio and picture responses are produced.

In the present tuning system, timed switch 51 and a timer 52 cooperate to enable AFT switch 30 and synchronization comparator 35 only for a predetermined time selected long enough for the nominal +1, −1 and −2 MHz tuning steps to be completed and the nominal tuning step to be reestablished after a new channel has been selected. In this manner, the improper tuning condition discussed with reference to FIG. 2 is avoided and music channels and other sources having unmodulated picture carriers, such as video accessories, are properly tuned. Specifically, since AFT switch 30 and synchronization comparator 35 are enabled during the initial nominal, +1, −1 and −2 MHz an improper tuning condition caused by the AFT response at +1.5 MHz from 45.75 MHz due to an RF carrier offset by approximately −1.25 MHz, as shown in FIG. 2, will be detected during the initial nominal frequency step. Accordingly, the +1 and −1 MHz steps will be successfully initiated to correctly tune the offset carrier as described above. Since music channels and video accessories produce picture carriers at nearly standard frequencies, when the second and final nominal tuning step is initiated, the picture carrier will be acquired in response to the AFT signal during the respective AFT control operation.

To this end, timer 52 responds to the "mute" signal to generate a timing pulse having a duration long enough for the initial nominal, +1, −1 and −2 frequency steps to be completed and the final nominal frequency step to be initiated. In response, timed switch 51 is closed to couple the output of AFT switch 30 to the AFT input of mode switch 28. Should synchronization comparator 35 generate an "improper tuning" signal, predetermined voltage PV is applied to the AFT input of mode switch 28 as described above to cause the predetermined local oscillator offset of 1.25 MHz to be exceeded. When the timing pulse ends, during the final nominal frequency step, timed switch 51 opens, thereby disabling the effect of AFT switch 30 and synchronization comparator 35.

Circuit implementations of AFT switch 30, synchronization comparator 35, timed switch 51 and timer 52 are shown in FIG. 3. Also shown are LPF 27, comprising an integrator including an inverting amplifier, and mute unit 50, comprising a set-reset flip-flop (FF) having its set (S) input receiving the "change" signal, its reset (R) input receiving the "lock" signal and its Q output connected to the gate electrode of an N channel field-effect transistor (FET) switch 54.

The circuit implementations of AFT switch 30 and composite synchronization comparator 35 commonly include a bipolar NPN transistor 36 functioning both as a threshold comparator and switch element. The base of transistor 36 is connected through a current limiting resistor 37 to the junction of a resistor 38 and a capacitor 39 comprising an average detector for developing a voltage across capacitor 39 representing the average value of the composite synchronization pulses.

The collector of transistor 36 is connected through a diode 40 and the collector emitter junction of a PNP transistor 55, comprising timed switch 51, and a resistor 41 to AFT discriminator 29. Resistors 41, 42 and 43 form a voltage divider network for scaling the AFT voltage applied to the collector of transistor 36 and mode switch 31. The AFT voltage generated by AFT discriminator 29 varies relative to a positive voltage level having a magnitude sufficiently large so that, assuming transistor 55 is conductive, transistor 36 is in condition to be rendered conductive when its base to emitter voltage is greater than approximately +0.7 volts. Diode 40 is poled to prevent transistor 36 from being rendered conductive in response to negative-directed portions of the AFT voltage.

The emitter of transistor 36 is connected through a resistor 44 to air/cable switch 18. The emitter of transistor 36 is also connected through a resistor 45 to a source of positive supply voltage SV. When air/cable switch 18 is in the "air" position, substantially all of supply voltage SV is applied to the emitter of transistor 36 through resistor 45. The value of SV is selected to prevent transistor 36 from being rendered conductive. When air/cable switch 18 is in the "cable" position, the voltage at the junction of resistors 44 and 45 is reduced from SV to a voltage TV. Voltage TV determines the threshold voltage at which transistor 36 is rendered conductive. Assuming that transistor 55 is conductive, when the average value of the composite synchronization pulses exceed TV by more than approximately 0.7 volt, transistor 36 is rendered conductive. Diode 40 is also rendered conductive at this time. As a result, the junction of resistors 41 and 42 is clamped to a relatively fixed positive voltage substantially determined by resistors 41, 42, 43, 44 and 45 and the voltage drops between the anode and cathode of diode 40 and between the collector and emitter of transistor 36. The latter voltage replaces the normally varying AFT voltage. Resistors 41, 42, 43, 44 and 45 are selected so that voltage PV developed at the junction of resistors 42 and 43 and applied to the mode switch 31 when transistor 36 is conductive causes the local oscillator signal to have a frequency offset greater than 1.25 MHz from its nominal value established during the previous PLL control cycle as described above. A relatively large value resistor 46 couples air/cable switch 18 to band selector 20.

The base of transistor 55, comprising timed switch 51, is connected through a current limiting resistor 56 to the junction of a resistor 57 and capacitor 58 which comprise, together with a diode 59 connected between the drain of FET 54, timer 52. Assuming that a channel has been selected for a long time (longer than the predetermined time duration established by timer 52), the Q output of mute FF 53, FF 53 having been reset by the "lock" signal, is at the low logic level. Accordingly, FET 54 and diode 59 are nonconductive. As a result, capacitor 58 is charged to positive supply voltage SV by virtue of the connection of resistor 57 to the supply terminal for supply voltage SV. Transistor 55 is nonconductive since supply voltage SV is selected to be at least 0.7 volt greater than the voltage at the junction of resistors 41 and 42.

When a new channel is selected, FF 53 is set in response to the "change" signal and its Q output goes to the high logic state, causing transistor 54 to be rendered conductive. This in turn forward biases diode 59 thereby rendering it conductive. In response, capacitor 58 rapidly discharges and transistor 55 is rendered conductive.

When the first "lock" signal is generated, the FF 53 is reset and its Q output again goes to the low logic level. This causes FET 54 and diode 59 to be rendered nonconductive. However, transistor 55 does not immediately become nonconductive but rather remains conductive until capacitor 58 is charged to a voltage near supply voltage +SV by the currents flowing through the base-emitter junction of transistor 55 and resistor 56 and resistor 57. Resistors 56 and 57 are selected in conjunction with capacitor 58 to ensure that transistor 55 will remain conductive for the tuning system to cycle through the initial nominal, +1, −1 and −2 MHz steps.

The following is a list of component and voltage values for the implementations which have been found experimentally satisfactory when employed in an RCA television receiver type CTC-108 which includes a PLL tuning control system of general type described above and which is described in "RCA Television Service Data-CTC 108, File 1980 C-5", published by RCA Corporation, Indianapolis, Ind., hereby incorporated by reference.

| parameter | value |
| --- | --- |
| resistor 37 | 100 kilohms |
| resistor 38 | 51 kilohms |
| capacitor 39 | 0.47 microfarads |
| resistor 41 | 12 kilohms |
| resistor 42 | 15 kilohms |
| resistor 43 | 20 kilohms |
| voltage SV | 5.1 volts DC |
| resistor 44 | 1 kilohm |
| resistor 45 | 1.5 kilohm |
| resistor 46 | 10 kilohms |
| resistor 56 | 150 kilohms |
| resistor 57 | 430 kilohms |
| capacitor 58 | 3.3 microfarads |
| AFT voltage | see typical amplitudes in FIG. 2 |

While the present invention has been described with reference to a particular embodiment in which the effect of AFT switch 30 and synchronization comparator 35 is described in a specific manner, other arrangements for this purpose, such as including a timed switch between the output of synchronization comparator 35 and the control input of AFT switch 30, or merely coupling a timing circuit to synchronization comparator 35 to selectively disable it, are contemplated. This and other modifications are intended to be within the scope of the present invention defined by the following claims.

What is claimed is:

1. In a multiband television receiver including channel selection means for selecting channels; RF means for selecting an RF carrier corresponding to a selected channel in response to the magnitude of a tuning control signal; local oscillator means for generating a local oscillator signal with a frequency corresponding to the selected channel in response to the magnitude of said tuning signal; mixer means for combining said selected RF carrier and said local oscillator signal to produce an IF signal including a picture carrier having a frequency with a predetermined nominal value; an automatic fine tuning (AFT) discriminator for generating an AFT signal having an amplitude representing the deviation of the frequency of said picture carrier from said nominal value; and a synchronization processing section for generating at least one synchronization signal; apparatus comprising:

tuning signal generating means coupled to said channel selection means and said AFT discriminator for generating said tuning signal and controlling its magnitude in accordance with the selected channel and in response to said AFT signal;

synchronization detector means for determining when said synchronization signal has a predetermined condition;

AFT control means responsive to said synchronization detector means for effectively decoupling said AFT signal from said tuning signal generating means when said synchronization signal has said predetermined condition; and timing means coupled to said channel selection means for disabling the operation of one of said synchronization detector means and said AFT control means at a predetermined time after a new channel is selected.

2. The apparatus recited in claim 1 wherein said tuning signal generating means includes reference frequency means for generating a reference frequency signal; comparison means for generating an error signal representing the phase and/or frequency deviation between said local oscillator signal and a comparison signal having a frequency substantially equal to the product of a programmable factor and the frequency of said reference signal; programmable factor control means for controlling the programmable factor, said programmable factor control means setting said programmable factor in accordance with the channel number of the selected channel when a new channel is selected; lock detector means for determining when said error signal has a predetermined condition; filter means for generating said tuning signal in response to one of said error and AFT signals; mode selection means for selectively coupling one of said AFT signal and said error signal to said filter means, said mode selection means being responsive to said channel selection means for coupling said error signal to said filter means when a new channel is selected and being responsive to said lock detector means to couple said AFT signal to said tuning signal generating means when said error signal has said predetermined condition; and offset detector means for determining when said local oscillator signal has a predetermined frequency offset from the frequency established when said error signal was coupled to said filter means after said AFT signal is coupled to said filter means; said mode selection means being responsive to said offset detector means for coupling said error signal to said filter means when said local oscillator signal has said predetermined frequency offset; and said programmable factor control means being responsive to said offset detector means for changing said programmable factor by a predetermined increment when said local oscillator signal has said predetermined frequency offset;

said AFT control means selectively couples a predetermined level to said filter means when said synchronization signal has said predetermined condition; and said timing means is responsive to said lock detector means to disable the operation of one of said synchronization detector means and said AFT control means at a predetermined delay after said error signal has said predetermined condition.

3. The apparatus recited in claim 2 wherein:

said mode selection means couples said error signal to said filter means and said programmable factor control means changes said programmable factor by a predetermined increment for each of a predetermined number of times said local oscillator signal has said predetermined frequency offset after said AFT signal has been coupled to said filter means and thereafter said mode selection means couples said error signal to said filter means and said programmable factor changes said programmable factor to the value set when the new channel was initially selected the next time said local oscillator signal has said predetermined frequency offset after said AFT signal has been coupled to said filter means; and said predetermined delay is at least as long as the time duration between a predetermined one of said predetermined number of times said error signal has said predetermined condition and the last time of said predetermined number of times said local oscillator signal has said predetermined frequency offset after said AFT signal has been coupled to said filter means.

4. The apparatus recited in claim 3 wherein:

said predetermined delay is at least as long as the time duration between the first time of said predetermined number of times said error signal has said predetermined condition and the last time of said predetermined number of times said local oscillator signal has said predetermined frequency offset after said AFT signal has been coupled to said filter means.

5. The apparatus recited in claim 3 wherein:

said AFT control means includes a first switching device having a first conduction path and a control input for controlling the conduction of said conduction path, said conduction path being normally nonconductive;

said timing means includes a second switch device having a conduction path and a control input for controlling the conduction of said conduction path, said conduction path being normally nonconductive; and delay means coupled to said lock detector means for generating a delay signal having a duration corresponding to said predetermined duration after said error signal has said predetermined condition;

said conduction paths of said first and second switching devices being connected in series between a point at which a predetermined DC voltage is developed and an input of said mode selection means to which said AFT signal is applied;

said control electrode of said first switching device being coupled to said synchronization detector means for rendering said conduction path of said first switching device conductive when said synchronization signal has said predetermined condition; and said control electrode of said second switching device being coupled to said pulse generating means for rendering said conduction path of said second switching device conductive in response to said delay signal.

6. The apparatus recited in claim 5 wherein:

said delay means includes a capacitor; first charging means for establishing a predetermined charge on said capacitor when a new channel is selected; and second charging means for causing the charge on said capacitor to change from said predetermined charge after said error signal has said predetermined condition at a predetermined one of said predetermined number of times.

* * * * *